United States Patent [19]

Beutler

[11] 4,205,279
[45] May 27, 1980

[54] CMOS LOW CURRENT RC OSCILLATOR

[75] Inventor: Robert R. Beutler, Beaverton, Oreg.

[73] Assignee: Motorola, Inc., Schaumburg, Ill.

[21] Appl. No.: 946,905

[22] Filed: Sep. 28, 1978

Related U.S. Application Data

[63] Continuation of Ser. No. 832,138, Sep. 12, 1977, abandoned.

[51] Int. Cl.$^2$ .................. H03K 3/353; H03K 4/50
[52] U.S. Cl. .................. 331/111; 331/108 D
[58] Field of Search ............ 331/111, 108 C, 108 D, 331/113 R

[56] References Cited

U.S. PATENT DOCUMENTS

| 3,659,224 | 4/1972 | Ball | 331/111 |
| 3,728,641 | 4/1973 | Fujita et al. | 331/116 R |
| 3,831,113 | 8/1974 | Ahmed | 331/111 |
| 3,886,485 | 5/1975 | Takahashi | 331/111 |
| 3,904,988 | 9/1975 | Hsiao | 331/111 |
| 3,967,216 | 6/1976 | Sakamoto et al. | 331/111 |

Primary Examiner—Siegfried H. Grimm
Attorney, Agent, or Firm—Joe E. Barbee

[57] ABSTRACT

A very low current oscillator having a comparator and circuitry for providing a reference for the comparator is provided. A capacitor is coupled to one input of the comparator while the circuitry for providing a reference is coupled to another input of the comparator. A current source is used to charge the capacitor. The circuitry for providing a reference is capable of providing two different reference levels. A transistor to discharge the capacitor is coupled to the output of the comparator.

7 Claims, 3 Drawing Figures

CMOS LOW CURRENT RC OSCILLATOR

This is a continuation of application Ser. No. 832,138, filed Sept. 12, 1977, and now abandoned.

BACKGROUND OF THE INVENTION

This invention relates, in general, to oscillators and more particularly, to an oscillator using very low currents.

In portable or battery operated equipment it is desirable to have circuitry which operates on very low current levels to conserve energy. Some battery operated devices such as smoke detectors require an oscillator. It is desirable that the oscillator consume a minimum amount of battery current.

Accordingly, it is an object of the present invention to provide an improved oscillator operating at very low current levels.

Another object of the present invention is to provide a complementary metal oxide semiconductor (CMOS) oscillator that can be built having repeatable part-to-part characteristics.

Yet another object of the present invention is to provide an oscillator having adjustable duty cycle and using low current levels.

A further object of the present invention is to provide a low current stable oscillator wherein the "high" period of the output duty cycle and the "low" period of the output duty cycle are independently adjustable.

SUMMARY OF THE INVENTION

In carrying out the above and other objects of the invention in one form, there is provided an improved low current oscillator having a comparator. Means for providing a reference are coupled to the comparator. A capacitor is also coupled to the comparator and a current source is used to charge the capacitor. Switching means controlled by an output from the comparator are used to discharge the capacitor. Also provided are means to allow the means for providing the reference to produce a first and a second reference level. The high and low period of the output are independently adjustable.

Preferably field effect transistors (FET) are used to reduce power consumption of the circuit. The oscillator can be built as a single CMOS chip except for the capacitor which is external to the chip. In addition, large resistors where required can be external to the circuit to conserve semiconductor area on the CMOS chip.

The subject matter which is regarded as the invention is set forth in the appended claims. The invention itself, however, together with further objects and advantages thereof, may be better understood by referring to the following detailed description taken in conjunction with the accompanying drawings.

The exemplifications set out herein illustrate the preferred embodiment of the invention in one form thereof, and such exemplifications are not to be construed as limiting in any manner.

DESCRIPTION OF THE PREFERRED EMBODIMENTS

Figure 1:
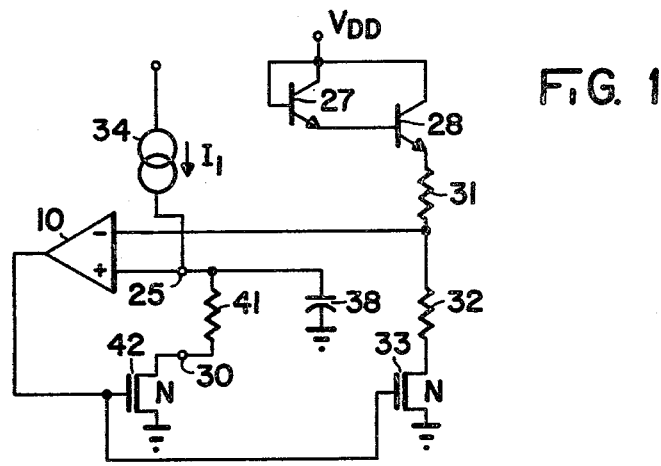
FIG. 1 illustrates one embodiment of the invention.

A low current stable oscillator capable of running at a low percentage duty cycle is illustrated in FIG. 1. The oscillator uses a differential comparator 10 and obtains a reference level from an internal P- resistor divider network having resistors 31 and 32. A current source 34 is coupled through connection 25 to capacitor 38. Capacitor 38 is connected through connection 25 to the noninverting input of differential comparator 10. The inverting input of differential comparator 10 is connected to a junction formed by resistors 31 and 32. Two substrate NPN transistors 27 and 28 are connected to resistor 31 while an N-channel MOS device 33 is connected to resistor 32. A control electrode of N-channel MOS device 33 is connected to the output of differential comparator 10. Also connected to the output of differential comparator 10 is N-channel MOS device 42. MOS device 42 is coupled to resistor 41 by connection 30. One end of resistor 41 is connected to external capacitor 38. Current source 34 charges capacitor 38 until the voltage across capacitor 38 reaches a level equal to 2 $V_{BE}$. At this point, the output of differential comparator 10 switches from a low level to a high level thereby turning on N-channel MOS devices 42 and 33. When MOS device 42 switches "on", capacitor 38 starts to discharge through resistor 41. When MOS device 33 starts to conduct the voltage reference at the junction of resistors 31 and 32 is pulled down to a value equal to the ratio of the ohmic value of resistor 32 divided by the total of the resistance of resistors 31 and 32 times the voltage $V_{DD} - 2 V_{BE}$. Voltage $V_{DD}$ is applied to the collectors of transistors 27 and 28. Resistors 31 and 32 serve as a voltage divider. Once capacitor 38 commences to discharge it will continue discharging until the voltage across the capacitor reaches the value of the voltage at the junction of resistors 31 and 32. At this point the output of differential comparator 10 once again changes state causing MOS devices 42 and 33 to turn off. Once MOS device 42 turns off, the current from current source 34 commences charging capacitor 38. From the above, it will be understood that the voltage reference appearing at the junction formed by resistors 31 and 32 is actually of two different values. The first value is equal to $V_{DD}$ minus 2 $V_{BE}$ and the second value is provided by voltage divider resistors 31 and 32.

Figure 2:
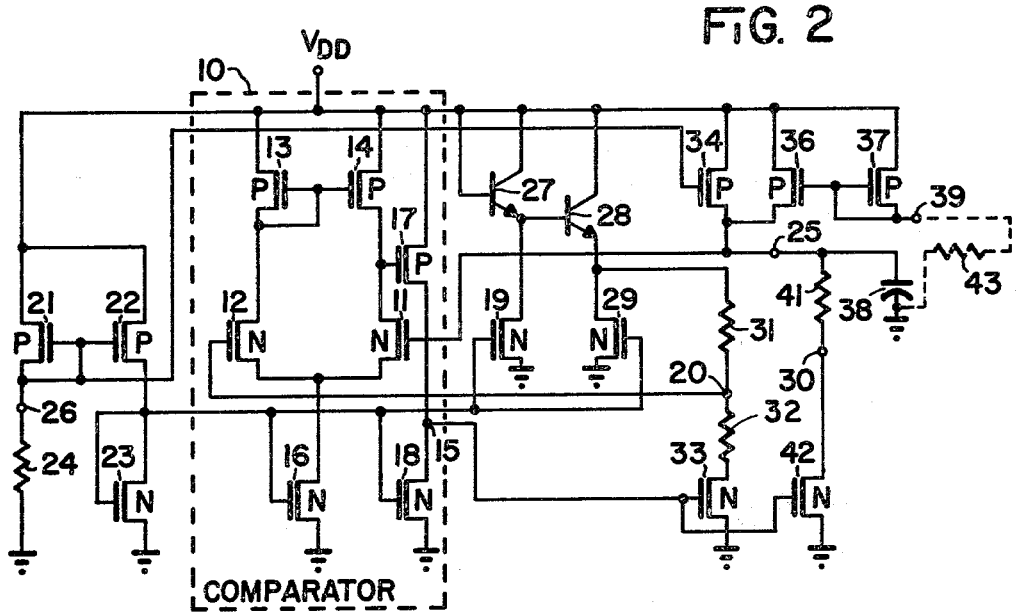
FIG. 2 is a detailed schematic diagram of the invention illustrated in FIG. 1.

FIG. 2 is a detailed schematic diagram of the circuit of FIG. 1. P-channel MOS devices 21 and 22 along with N-channel MOS device 23 form a bias network for the oscillator. Resistor 24 is a bias current setting resistor for the network. The basic bias current is set by MOS device 23 which has its gate and drain connected together. The current for MOS device 23 comes from P-channel MOS device 22 and is being mirrored off of P-channel MOS device 21. Resistor 24 which is coupled to MOS device 21 by connection 26 provides a gate voltage for P-channel MOS device 22. This establishes a current flow through MOS device 22. This current sets the voltage at the drain gate connection of MOS device 23. This voltage is applied to the gates of other devices thereby establishing the current flow through these other devices. The drain of P-channel MOS device 21 is connected to the gate of P-channel MOS device 34 which serves as the current source to charge capacitor 38. Differential comparator 10 has an N-channel MOS device 16 as a current source. This current source is connected to the differential N-channel MOS devices 11 and 12. P-channel MOS device 13 serves as a load for MOS device 12 while P-channel MOS device 14 serves as a load for MOS device 11. The output for the differentially connected MOS devices 11 and 12 is connected to the gate electrode of P-channel MOS device 17. MOS device 17 is connected in series with N-channel MOS device 18. Therefore, the output for differential comparator 10 is taken from node 15 which is between the junction formed by MOS devices 17 and 18. Node 15 is connected to the gate electrode of N-channel MOS device 42 which is coupled to capacitor 38 by connection 30 and resistor 41. Node 15 is also connected to the gate electrode of N-channel MOS device 33.

Substrate NPN transistor 27 has its base and collector connected to the $V_{DD}$ bus. The emitter of substrate NPN transistor 27 is connected to the base of substrate NPN transistor 28. The emitter of substrate NPN transistor 28 is connected to series resistors 31 and 32 which in turn are connected in series with N-channel MOS device 33. This series arrangement provides a voltage reference at node 20 which is connected to the gate electrode of N-channel MOS device 12 and serves as the reference level for differential comparator 10. Also connected to the emitters of substrate NPN transistors 27 and 28 are N-channel MOS devices 19 and 29 respectively. The gate electrode of MOS devices 19 and 29 are connected to N-channel MOS device 23 to establish the current level through MOS devices 19 and 29.

The current through MOS devices 19 and 29 is selected to produce approximately 200 nanoamps of collector to emitter current flow through substrate NPN transistors 27 and 28. Therefore the base to emitter voltage drop $V_{BE}$ equals approximately 1.1 volts for substrate transistors 27 and 28. Accordingly, when MOS device 33 is nonconductive the voltage appearing at node 20, which is the reference voltage level, will be approximately $V_{DD}$ minus 1.1. Therefore, since the upper reference level or upper trip point for comparator 10 is very near $V_{DD}$ a current source 34 is used to charge capacitor 38. This avoids the asymptotic charging characteristic common to RC type charging networks. This also minimizes the period variation of the oscillator's frequency due to $V_{BE}$ variation since by using a current source to charge capacitor 38 the capacitor is charged linearly. Use of substrate NPN transistors 27 and 28 avoids the use of another resistor to establish the upper trip point for comparator 10.

Current can be added to current source 34 by adding another external resistor 43 shown in phantom. Resistor 43, shown in phantom, is connected to ground and to connection 39. Connection 39 is connected to the control electrodes of P-channel MOS devices 36 and 37. Normally MOS devices 36 and 37 would not contribute any current to current source 34 until external resistor 43 is connected to the circuit.

Connections 25, 26, 30 and 39 represent interface connection points for components which are preferably not formed as part of the CMOS chip.

The static current of differential comparator 10 can be adjusted by the selection of resistor 24. Preferably resistor 24 is an external resistor which is not part of the MOS chip and therefore can be made relatively large. As an example, if resistor 24 had a value of 10 megohms and $V_{DD}$ was equal to 10 volts, it can be seen that the current through comparator 10 would be very low. Capacitor 38 is also external from the CMOS chip and charges and discharges between an upper and a lower trip point. The upper trip point is set by the sum of the $V_{BE}$ drops of substrate emitter followers 27 and 28. Since the lower trip point is not near the $V_{SS}$ rail or voltage level, a current source discharge configuration is not necessary. The lower trip point is determined by the resistor ratios of the ohmic value of resistor 32 divided by the sum of resistors 31 and 32 times $V_{DD}$ minus 2 $V_{BE}$. Resistors 31 and 32 are on chip P- resistors. It becomes impractical to make resistors 31 and 32 greater than 2 megohms because of the large amount of chip area that would be consumed. It should be noted that current only flows through resistors 31 and 32 during the small percentage of time when the output of differential comparator 10, which appears at node 15, is high. Accordingly, the average current passing through resistor 31 and 32 is very low.

The oscillator will remain relatively constant with changes in $V_{DD}$ since during discharge of capacitor 38 the period is determined by the equation $$T = RC \ln \frac{V_L}{V_{DD}}.$$

Where T equals time, R equals the resistance of resistor 41 and C equals the capacitance of capacitor 38. $V_L$ is the lower reference level or low trip point, and the ratio $V_L$ divided by $V_{DD}$ is simply the ratio of resistor 32 divided by the sum of resistors 31 and 32. The charging of capacitor 38 is determined by the equation $$T = \frac{C(V_H - V_L)}{I_{CS}}$$

where $V_H$ equals the upper trip point and $I_{CS}$ equals the charging current for capacitor 38. Thus, it can be seen that when $V_{DD}$ changes, the change in the denominator will very nearly cancel the changes in the numerator. During the discharge period the linear output resistance of MOS device 42 is assumed to be low compared to the resistance of resistor 41. Resistor 41 preferably is an external resistor. Accordingly, it can be seen that the discharging of capacitor 38 can be controlled external to the circuit by resistor 41 and the charging current for capacitor 38 can also be increased by the addition of an external resistor 43. This allows the charging and discharging periods to be independently controlled.

By now it should be appreciated that the present invention has provided a low current oscillator having a differential comparator. The invention has the advantage of having extremely good part-to-part repeatability and also the ability to adjust the duty cycle of the oscillator's output.

Figure 3:
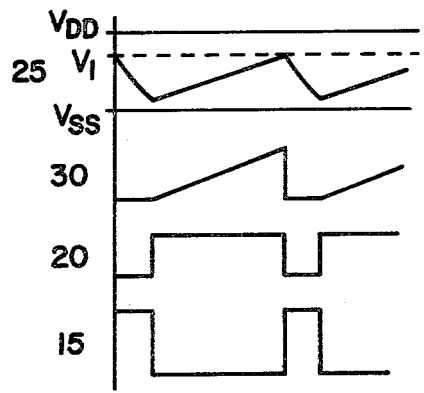
FIG. 3 shows waveforms of the signals at certain points of the circuitry of FIG. 2.

The top waveform 25 of FIG. 3 is the waveform appearing at connection 25 of FIG. 2 and shows the charging of capacitor 38. It will be noted that capacitor 38 charges linearly to a peak voltage V1 which is just below $V_{DD}$. If a resistor were connected in series with the capacitor to a voltage, then of course, the capacitor would not charge linearly. The second waveform in FIG. 3 is waveform 30 which appears at connection 30. Waveform 20 illustrates the two different voltage reference levels appearing at node 20. Waveform 15 illustrates the output of differential comparator 10 appearing at node 15.

Consequently, while in accordance with the patent statutes, there has been described what at present is considered to be the preferred form of the invention. It will be obvious to those skilled in the art that numerous changes and modifications may be made herein without departing from the spirit and scope of the invention, and it is therefore aimed in the following claims to cover all such modifications.

What is claimed as new and desired to be secured by Letters Patents of the United States is:

1. A low current oscillator using a differential amplifier as a comparator and having a first and a second voltage terminal, the differential amplifier having a current source, comprising: bias network for providing bias currents for the oscillator, the bias network being coupled to the comparator to establish a current through the current source; at least one substrate NPN transistor for providing a voltage drop; a pair of resistors in series with the substrate NPN transistor to provide a reference voltage for the comparator; switching means in series with the pair of resistors for completing a voltage divider circuit having the substrate NPN transistor and the pair of resistors, the switching means being enabled by an output from the comparator, and the at least one substrate NPN transistor, the pair of resistors and the switching means all being serially coupled between the first and second voltage terminals; a capacitor coupled to the comparator; a second current source coupled to the capacitor for linearly charging the capacitor; and discharging means coupled to the capacitor to discharge the capacitor, the discharging means being enabled by the output of the comparator and comprising a resistor in series with a field effect transistor.

2. The low current oscillator of claim 1, wherein the comparator has field effect transistors and the second current source has field effect transistors and current through the current source is established by the bias network.

3. An integrated circuit low current oscillator having an external capacitor and a first and second external resistor, comprising: a bias network coupled to the first external resistor wherein the first external resistor establishes a desired amount of current flow through the bias network; a differential amplifier for comparing a reference level against a charge on the external capacitor, the differential amplifier having a constant current source which is controlled by the bias network; a first and a second resistor connected in series; at least one substrate transistor connected in series with the first and second resistors to establish a first reference level, the at least one substrate transistor having a collector coupled to a voltage source terminal and having an emitter coupled to the first and second resistors, the first and second resistors being coupled to the differential amplifier to provide the reference level to the differential amplifier; at least one field effect transistor coupled to the at least one substrate transistor to establish a predetermined current flow through the substrate transistor, the at least one field effect transistor being controlled by the bias network; a first field effect transistor being in series with the first and second resistors and coupled to the differential amplifier so that an output from the differential amplifier enables the first field effect transistor thereby providing a current path through the first and second resistors to establish a second reference level from the series first and second resistors; a current source controlled by the bias network and coupled to the external capacitor for charging the external capacitor; and a second field effect transistor coupled to the external capacitor by the second external resistor to discharge the external capacitor, the second field effect transistor being controlled by the output from the differential amplifier.

4. A low current oscillator, comprising: a comparator having a first and a second input and an output; a current source reference for providing a reference current, the current source reference having a resistor to establish a predetermined reference current; a current source coupled to the current source reference; means for providing a reference for the comparator, the means for providing being coupled to the first input of the comparator and being capable of providing a first and a second reference level to the first input; a capacitor coupled to the second input of the comparator and coupled to the current source for charging the capacitor; and means to discharge the capacitor, the means to discharge being coupled to and enabled by the output of the comparator, the means for providing including a second current source for establishing a reference level which is used as the first reference level and wherein the comparator and current source includes field effect transistors, and the means for providing further including at least one NPN transistor and at least one resistor in series with a field effect transistor coupled to a voltage source terminal, the field effect transistor being enabled by the output of the comparator to provide the second reference level, the second current source including another field effect transistor coupled to the at least one NPN transistor to establish a predetermined current flow through the NPN transistor, the another field effect transistor being controlled by the current source reference.

5. The low current oscillator of claim 4 wherein the means to discharge includes a field effect transistor having a control electrode coupled to the output of the comparator.

6. The low current oscillator of claim 4 further having capability of increasing the charging current to the capacitor.

7. An integrated circuit CMOS low current oscillator, comprising: a comparator having a first and a second input and an output; an external capacitor coupled to the second input; a first current source coupled to the external capacitor for charging the capacitor; first switching means controlled by the output of the comparator and coupled to the capacitor for discharging the capacitor; means for providing a reference level for the comparator and being coupled to the first input of the comparator, the means for providing being capable of providing a first and a second reference level and having at least two series connected resistors; a second switching means in series with the means for providing, the second switching means being coupled to and controlled by the output of the comparator to provide the second reference level by completing a current path through the two series connected resistors; and a second current source coupled to the means for providing to aid in establishing the first reference level; a first external resistor in series with the capacitor when the capacitor is being discharged; and a second external resistor for enabling a third current source for providing additional charging current to the capacitor.

* * * * *